(12) United States Patent
Frost et al.

(10) Patent No.: US 10,173,548 B2
(45) Date of Patent: Jan. 8, 2019

(54) METHOD FOR DETERMINING CHARACTERISTICS OF BATTERY SEGMENTS FOR OPERATING A BATTERY PACK WITH MODULES OF DIFFERENT CHEMICAL MAKEUP FIELD

(71) Applicant: GM Global Technology Operations LLC, Detroit, MI (US)

(72) Inventors: Patrick E. Frost, Berkley, MI (US); Rory B. Fraga, Troy, MI (US); Alexander K. Suttman, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 10 days.

(21) Appl. No.: 15/608,330

(22) Filed: May 30, 2017

(65) Prior Publication Data
US 2018/0345818 A1 Dec. 6, 2018

(51) Int. Cl.
*B60L 11/18* (2006.01)
*G06F 17/30* (2006.01)

(52) U.S. Cl.
CPC ....... *B60L 11/1879* (2013.01); *B60L 11/1838* (2013.01); *B60L 11/1877* (2013.01); *G06F 17/30038* (2013.01)

(58) Field of Classification Search
CPC .................................................. B60L 11/1861
USPC ........................................................ 320/124
See application file for complete search history.

(56) References Cited

U.S. PATENT DOCUMENTS

| 7,235,937 B2 * | 6/2007 | Takai et al. ......... B60L 15/2045 318/139 |
| 8,054,030 B2 * | 11/2011 | Son et al. ............... H02P 21/32 318/102 |
| 2015/0231984 A1 * | 8/2015 | Zhang et al. ....... B60L 11/1861 318/139 |

* cited by examiner

*Primary Examiner* — Sun Lin
(74) *Attorney, Agent, or Firm* — Harness, Dickey & Pierce, P.L.C.

(57) ABSTRACT

A method of adjusting battery control software for a battery having a plurality of battery sections includes connecting the battery to a charging system and a discharging system. A charging operation or a discharging operation is then initiated while monitoring a voltage response of each battery segment during the charging operation or the discharging operation. The voltage response is then correlated to a calibration database for selecting a control algorithm for each battery segment from the calibration database.

15 Claims, 3 Drawing Sheets

METHOD FOR DETERMINING CHARACTERISTICS OF BATTERY SEGMENTS FOR OPERATING A BATTERY PACK WITH MODULES OF DIFFERENT CHEMICAL MAKEUP FIELD

The present disclosure relates to vehicle battery packs and more practically, a method to operate the battery pack with modules of different chemical makeup.

BACKGROUND

This section provides background information related to the present disclosure which is not necessarily prior art.

In order to more efficiently and cost-effectively service batteries, such as those used in hybrid and electric vehicles, high-voltage battery packs are assembled as sections. New or refurbished sections can replace excessively degraded or otherwise faulted sections, decreasing the repair cost and time. However, a trend in the battery industry is to continually create newer and higher energy variations of battery chemistry, so the battery chemistry that a vehicle is designed with is often not the same chemistry it ends production with, for example. To date, the state of the art controls software implementations support battery packs that contain the same chemistry or chemistries that vary only subtly, meaning they have nearly identical open circuit voltage/state of charge relationships and dynamic voltage behavior. Because of this, industrial users of batteries have to build up a stockpile of battery packs/sections to continue to perform section replacements for early production runs; for example, in the introductory model years of an electrified vehicle. This is required because the controls are not compatible with mixed sections once the battery chemistry has changed significantly. Present disclosure describes a method to make the control software compatible with battery sections of mixed battery chemistry.

SUMMARY

This section provides a general summary of the disclosure, and is not a comprehensive disclosure of its full scope or all of its features.

Each battery chemistry has a unique profile in the open circuit voltage/state of charge relationship. While a battery is being charged or discharged, the dynamic voltage behavior of the battery closely mimics the open circuit voltage/state of charge relationship. Using this knowledge, the voltage trace of a charging or discharging event can be correlated to potential chemistries existing in a calibration database utilizing the open circuit voltage/state of charge curve, with battery model parameters, charging termination criteria, and electrochemical parameters also in the database. The calibrations corresponding to the highest scoring potential chemistries are used for the pack-based algorithms. Section or cell-based algorithms can also be tracked using the same method.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Figure 1:
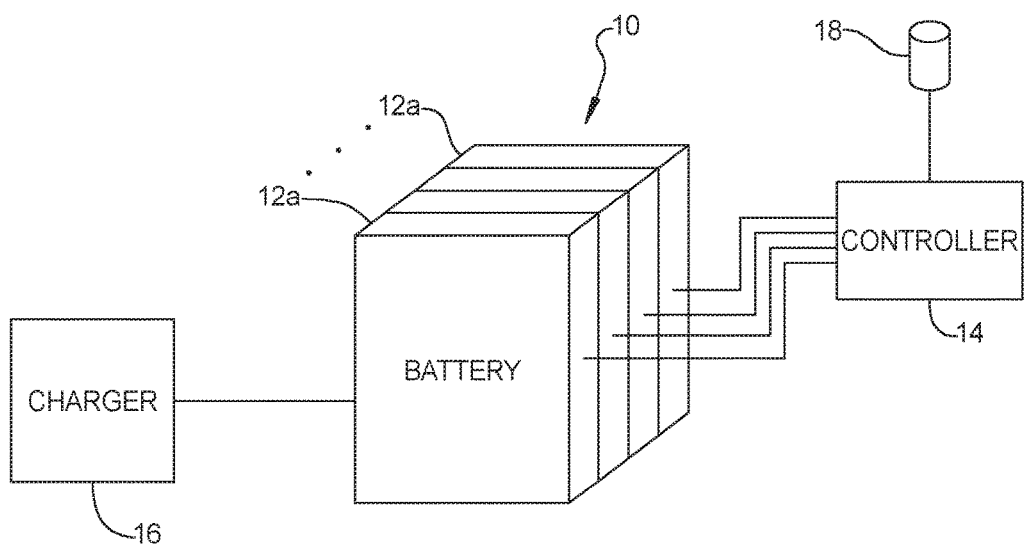
FIG. 1 is a schematic view of a battery charging system according to the principles of the present disclosure.

With reference to FIG. 1, a battery pack 10 used in an exemplary fashion in a hybrid or electric vehicle is shown including a plurality of assembled sections 12a-n. A controller 14 is provided with battery controls software for controlling the charging and discharging of the battery sections 12a-n. The controller 14 is provided with an automatic diagnostic/service mode that enables the battery sections 12a-n to have varying chemistries to be used in a single pack 10. The battery pack can be connected to a battery charger 16.

According to an aspect of the present disclosure, the method of the automatic diagnostic/service mode includes charging the battery pack 10 after it has been discharged for a predetermined amount of time and monitoring a voltage response of each battery segment 12a-12n during the charging operation. Alternatively, the method can include discharging the battery pack 10 for a predetermined amount of time and monitoring a voltage response of each battery segment 12a-12n during the discharging operation. The voltage response can include a detection of the open circuit voltage/state of charge or discharge relationship. The controller 14 then constructs reference voltages so that the monitored voltage response data can be compared to a calibration database 18 of predetermined voltage response characteristics from other known battery segment chemistries. The controller 14 then adopts a control algorithm for each battery segment based upon the correlated voltage response characteristics.

Figure 2:
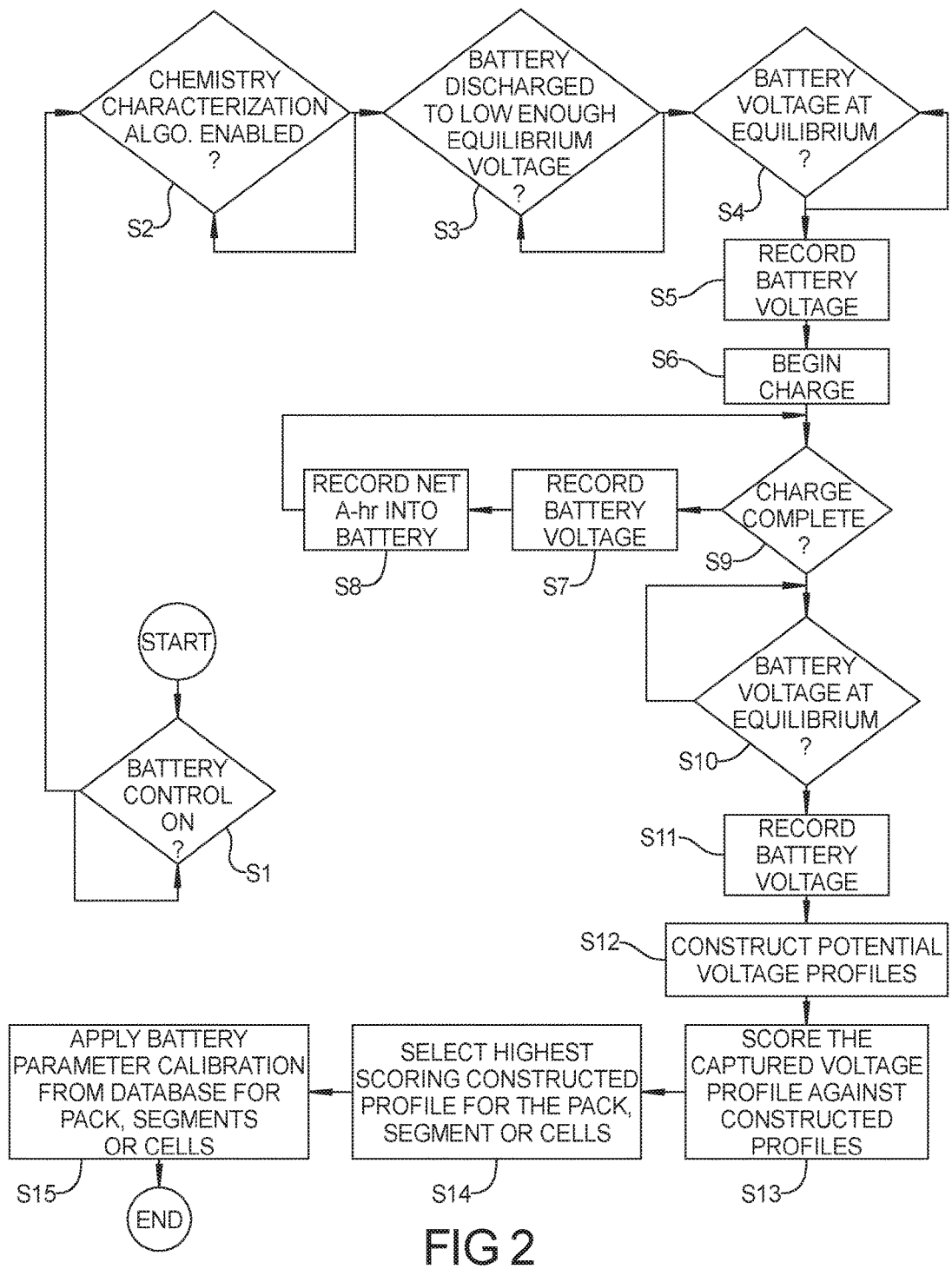
FIG. 2 is a flow diagram illustrating aspects of the automatic diagnostic/service mode for operating battery packs with modules of different chemical makeup.

With reference to FIG. 2, an exemplary automatic diagnostic service mode is started by activating the battery control module "ON" at step S1. At step S2, the chemistry characterization algorithm is enabled. At step S3, the battery is discharged to a level low enough for equilibrium voltage. At step S4 it is determined whether or not the battery voltage is at equilibrium. At step S5, the battery voltage is recorded for the pack, section or cells 12a-n.

Figure 3:
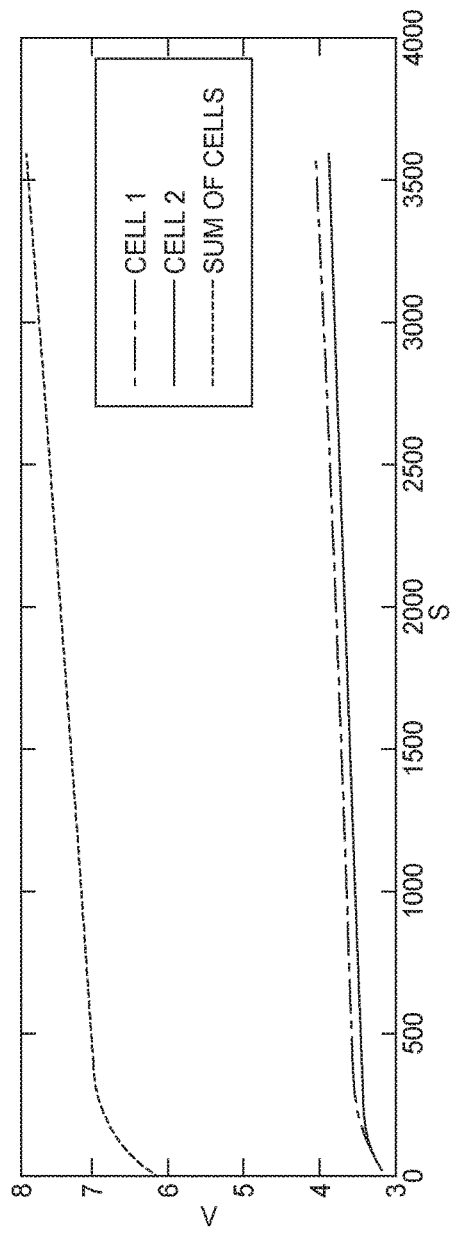
FIG. 3 is a graph of exemplary measured battery voltage over time during a charging operation.
Figure 4:
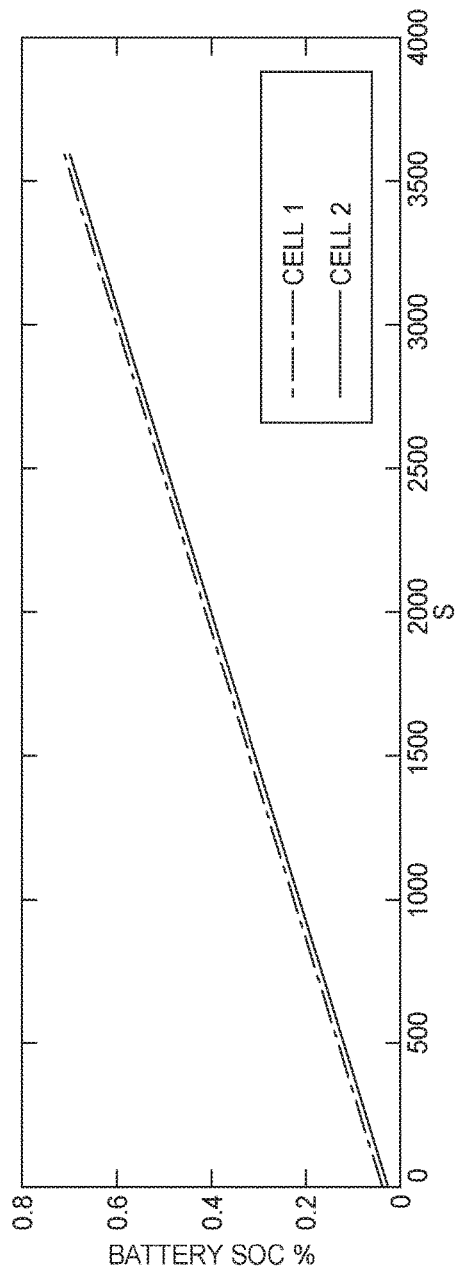
FIG. 4 is a graph of exemplary battery state of charge over time during a charging operation.

At step S6, a charge of the battery pack is begun during which the battery voltage at each battery section 12a-n is recorded periodically at step S7 and the cumulative sum of the current charged into the battery (in Ampere-hours) is also recorded at step S8 until the charge is determined to be complete at step S9. FIG. 3 is a graph of exemplary measured battery voltage (V) over time during a charging operation and FIG. 4 is a graph of exemplary battery state of charge (as a percentage of charge capacity) over time during a charging operation. At step S10, it is determined if the battery voltage is at equilibrium. At step S11, the voltages are recorded for the battery pack, section or cells 12a-n. Although steps S3 through S11 describe a charging procedure, a battery discharge could also be performed to the same effect with voltages being recorded for the battery pack, section or cells. Then at step S12, potential voltage profiles are constructed from the database of compatible battery chemistries and at step S13 the captured voltage profiles are scored against the constructed profiles. The slope and other dynamic characteristics of the battery voltage and state of charge or discharge response can be used to match other characteristics of known battery packs, sections or cells. At step S14, the highest scoring constructed profile is selected for the packs, sections or cells 12a-n. At step S15, the battery parameter calibrations are applied to the control unit 14 for the pack, section or cells 12a-n.

Until now, the state of the art controls software for battery packs supports battery packs that contain the same chemistry or chemistries that vary only subtly, meaning they have almost identical open-circuit-voltage/state-of-charge relationships and dynamic voltage behavior. Because of this, the industrial users of batteries have had to build up and store a stockpile of battery packs/sections for early production runs, as the controls are not compatible with mixing the sections. By implementing the method of the present disclosure users and manufacturers can save on warranty and warehouse costs as well as offering aftermarket upgrades. In the exemplary embodiment, removing the need to stockpile sections enhances the profitability of electric vehicles.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of adjusting battery control software for a battery having a plurality of battery segments, at least one battery segment of said plurality of battery segments having a different chemistry than other battery segments of said plurality of battery segments, the method comprising:
   monitoring, by a controller, a voltage response of each battery segment of the plurality of battery segments;
   associating, by the controller, the voltage response of said each battery segment to a calibration database and selecting, by the controller, a control algorithm for said each battery segment from the calibration database; and
   discharging or charging the plurality of battery segments during operation in a vehicle, by the controller, according to the selected control algorithm for said each battery segment.

2. The method according to claim 1, wherein the battery is connected to a charging system.

3. The method according to claim 1, wherein the associating is performed during a charging operation.

4. The method according to claim 1, wherein the monitoring a voltage response includes measuring a voltage of the battery over time during a charging operation.

5. The method according to claim 1, wherein the monitoring a voltage response includes measuring a state of charge of the battery over time during a charging operation.

6. The method according to claim 5, further comprising discharging the battery to a sufficiently low state of charge prior to initiating the charging operation.

7. The method according to claim 6, further comprising determining, by the controller, whether a voltage of the battery is at equilibrium prior to initiating the charging operation.

8. The method according to claim 5, further comprising recording, by the controller, a voltage for each battery segment prior to initiating the charging operation.

9. The method according to claim 1, wherein the battery is connected to a discharging system.

10. The method according to claim 1, wherein the associating is performed during a discharging operation.

11. The method according to claim 10, wherein the monitoring a voltage response includes measuring a voltage of the battery over time during the discharging operation.

12. The method according to claim 10, wherein the monitoring a voltage response includes measuring a state of charge of the battery over time during the discharging operation.

13. The method according to claim 10, further comprising charging the battery to a sufficiently high state of charge prior to initiating the discharging operation.

14. The method according to claim 13, further comprising determining, by the controller, whether a voltage of the battery is at equilibrium prior to initiating the discharging operation.

15. The method according to claim 10, further comprising recording, by the controller, a voltage for each battery segment prior to initiating the discharging operation.

* * * * *